(12) United States Patent
Regen et al.

(10) Patent No.: US 7,462,044 B1
(45) Date of Patent: Dec. 9, 2008

(54) THUMB DRIVE WITH RETRACTABLE USB CONNECTOR

(75) Inventors: Paul Regen, Felton, CA (US); Peter Garrett, Aptos, CA (US)

(73) Assignee: Ennova Direct, Inc., Scotts Valley, CA (US)

(*) Notice: Subject to any disclaimer, the term of this patent is extended or adjusted under 35 U.S.C. 154(b) by 0 days.

(21) Appl. No.: 12/193,376

(22) Filed: Aug. 18, 2008

Related U.S. Application Data

(63) Continuation-in-part of application No. 11/927,079, filed on Oct. 29, 2007, which is a continuation of application No. 11/473,638, filed on Jun. 22, 2006, which is a continuation of application No. 11/009,329, filed on Dec. 9, 2004, now Pat. No. 7,070,425, which is a continuation-in-part of application No. 10/903,412, filed on Jul. 29, 2004, now Pat. No. 6,979,210.

(51) Int. Cl.
*H01R 13/60* (2006.01)
(52) U.S. Cl. ...................... 439/131; 439/142
(58) Field of Classification Search ........... 439/131, 439/136, 135, 142
See application file for complete search history.

(56) References Cited

U.S. PATENT DOCUMENTS

| | | | | |
|---|---|---|---|---|
| 5,822,183 A * | 10/1998 | Kanda et al. | ............ | 361/684 |
| 6,743,030 B2 * | 6/2004 | Lin et al. | ............ | 439/131 |
| 6,979,210 B2 * | 12/2005 | Regen et al. | ............ | 439/131 |
| 7,070,425 B2 * | 7/2006 | Regen et al. | ............ | 439/131 |
| 7,090,515 B2 * | 8/2006 | Regen et al. | ............ | 439/131 |
| 7,125,267 B1 * | 10/2006 | Yeh | ............ | 439/131 |
| 7,361,032 B2 * | 4/2008 | Loftus | ............ | 439/131 |
| 2006/0240692 A1 * | 10/2006 | Regen et al. | ............ | 439/131 |
| 2008/0050952 A1 * | 2/2008 | Regen et al. | ............ | 439/131 |
| 2008/0233776 A1 * | 9/2008 | Tang et al. | ............ | 439/131 |

* cited by examiner

*Primary Examiner*—Neil Abrams
*Assistant Examiner*—Phuong Nguyen
(74) *Attorney, Agent, or Firm*—Central Coast Patent Agency, Inc.

(57) ABSTRACT

A thumb drive has an elongated housing enclosing a coupled memory and male USB connector constrained on a translation mechanism in the direction of the long dimension of the housing, with an opening at a first end of the housing through which the male USB connector may extend and retract, a cover hinged at a second end opposite the first end of the housing, the cover shaped to fold over the housing when closed and having an extension that covers the opening for the connector at the first end of the housing, and a mechanism coupling the cover and the USB connector such that the cover being rotated from the closed position extends the USB connector from the opening, the connector fully extended with the hinged cover fully rotated open.

11 Claims, 14 Drawing Sheets

THUMB DRIVE WITH RETRACTABLE USB CONNECTOR

CROSS-REFERENCE TO RELATED DOCUMENTS

The present application is a continuation-in-part of co-pending application Ser. No. 11/927,079 filed Oct. 29, 2007, which is a continuation of co-pending application Ser. No. 11/473,638, filed Jun. 22, 2006, which is a continuation of Ser. No. 11/009,329, filed on Dec. 9, 2004 and issued as U.S. Pat. No. 7,070,425, which is a continuation-in-part of patent application Ser. No. 10/903,412, filed on Jul. 29, 2004 and issued as U.S. Pat. No. 6,979,210, which claims priority to provisional application No. 60/528,645 filed Dec. 10, 2003. The disclosures of the prior applications are incorporated in their entirety by reference, and priority is claimed for the disclosures as of their filing dates.

BACKGROUND OF THE INVENTION

1. Field of the Invention

The present invention is in the field of computer mass storage devices, and pertains more particularly to solid-state USB connectable drives.

2. Discussion of the State of the Art

In the computer arts there continues to be motivation for increased density and ease-of-use in mass storage devices. A solid state device known now in the art as a thumb drive was relatively recently introduced advancing the standard for both density and ease-of-use, and such hot-plug drives are made by several manufacturers. A common feature of thumb drives as known in the art is a male USB connector, and functionality to hot-plug and remove, that is, without turning off the computer to which the drive is connected and disconnected. Another common feature is a plastic protective cover for the male USB connector.

Although the advance in the mass storage art with the advent of thumb drives is dramatic, there are still some problems with such a system. For example, the plastic covers for use on the male USB connectors are not very secure, and tend to come loose and be lost. As a remedy, many manufacturers provide two and sometimes three plastic covers with each device sold, often with different colors. Still another problem is that USB ports on computers are not universally easily visible and accessible. Some such ports are on the back of tower cases which are often placed under desks or other furniture, so finding an unused USB female port for connecting the male USB connector of a thumb drive is often not trivial. When a female port is out of sight or in a darkened area, the connection must often be made by feel alone. Still further, when the thumb drive is connected to a computer, the plastic protective cover is removed, and is easily misplaced.

There are also other functions that may be accomplished with the considerable memory available with thumb drives, and their relatively easy connectivity to personal computers and other computerized appliances. One such function is as an MP3 player, to download MP3 files, such as music files, from a computerized appliance, and an ability to play these files into an ear piece, headphone or amplifier from the thumb drive.

Therefore what is clearly needed is a way to dispense with the plastic covers and still protect the male USB connector for thumb drives, a way to aid in the search for unused USB ports, and aid in the engagement of the male USB connector of the thumb drive with the female port on the computer, and a way to use the thumb drive as an MP3 player.

SUMMARY OF THE INVENTION

In one embodiment a thumb drive is provided comprising an elongated housing enclosing a coupled memory and male USB connector constrained on a translation mechanism in the direction of the long dimension of the housing, with an opening at a first end of the housing through which the male USB connector may extend and retract, a cover hinged at a second end opposite the first end of the housing, the cover shaped to fold over the housing when closed and having an extension that covers the opening for the connector at the first end of the housing, and a mechanism coupling the cover and the USB connector such that the cover being rotated from the closed position extends the USB connector from the opening, the connector fully extended with the hinged cover fully rotated open.

Also in one embodiment the mechanism coupling the cover and the USB connector is a flexible strip coiled such that rotating the cover open uncoils the strip translating the connector from the housing through the opening. In another embodiment the mechanism may be a geared mechanism.

In another embodiment the drive further comprises an interactive display implemented on an upper surface of the housing, such that the display is covered when the cover is rotated closed, and uncovered and accessible to a user when the cover is rotated open. The interactive display may have mechanisms for the user to select specific files and initiate specific functions. In another embodiment the interactive display further comprises a fingerprint reader for scanning a fingerprint or thumbprint of the user, and comprising a function for comparing a scanned print with a stored print. In some embodiments the interactive display is one of a light-emitting diode or an organic light-emitting diode. The finger print reader may change color to indicate success or failure of a match. In some embodiments of the thumb drive the interactive display presents text to indicate success or failure of a match.

In some embodiments there is further a light-emitting element for indicating transfer of data to or from the drive. The light-emitting element may display one color when no data is being transferred and another color when data is being transferred.

BRIEF DESCRIPTION OF THE DRAWING FIGURES

Figure 3A:
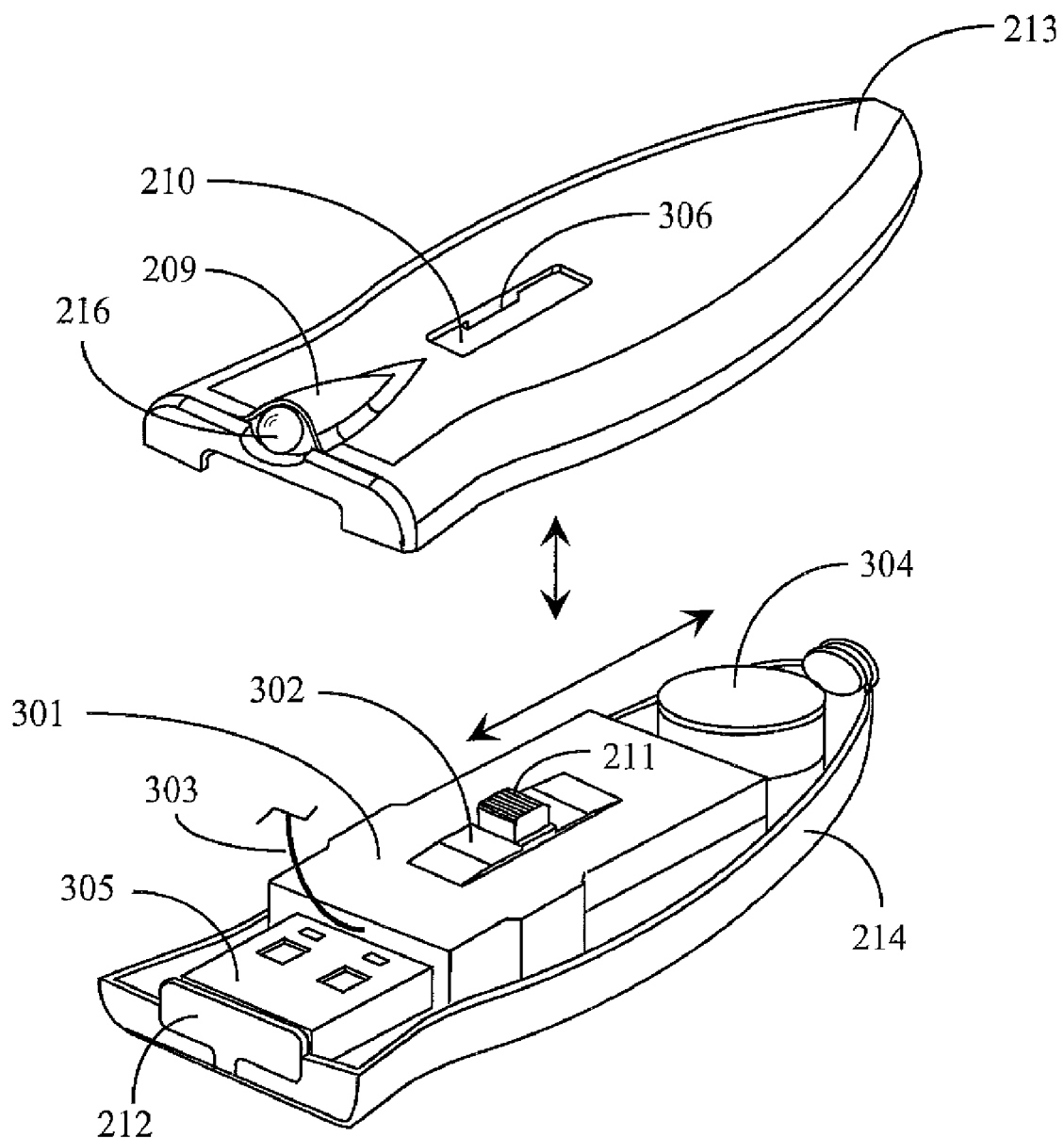
FIG. 3a is an exploded view of the thumb drive of FIG. 2.
Figure 3B:
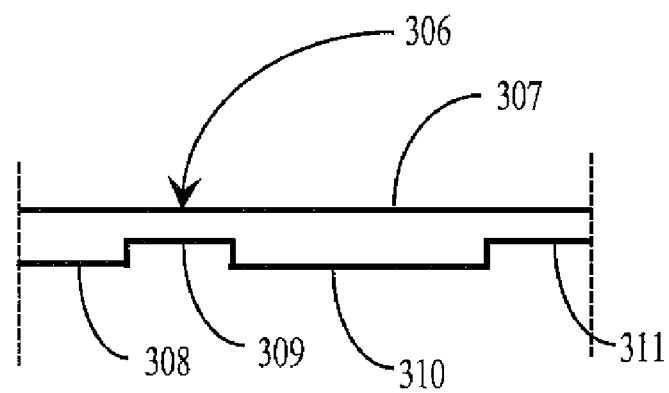

FIG. 3b, c, and d show details for detenting in an embodiment of the invention.

Figure 4A:
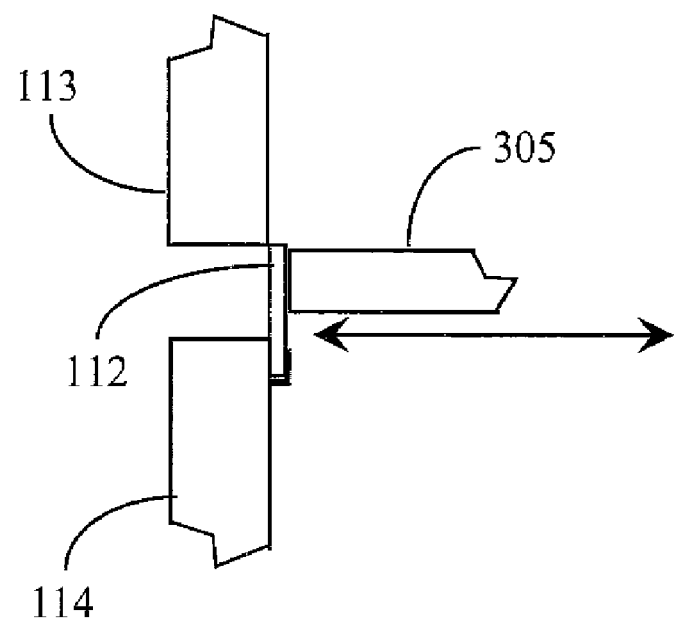
Figure 4B:
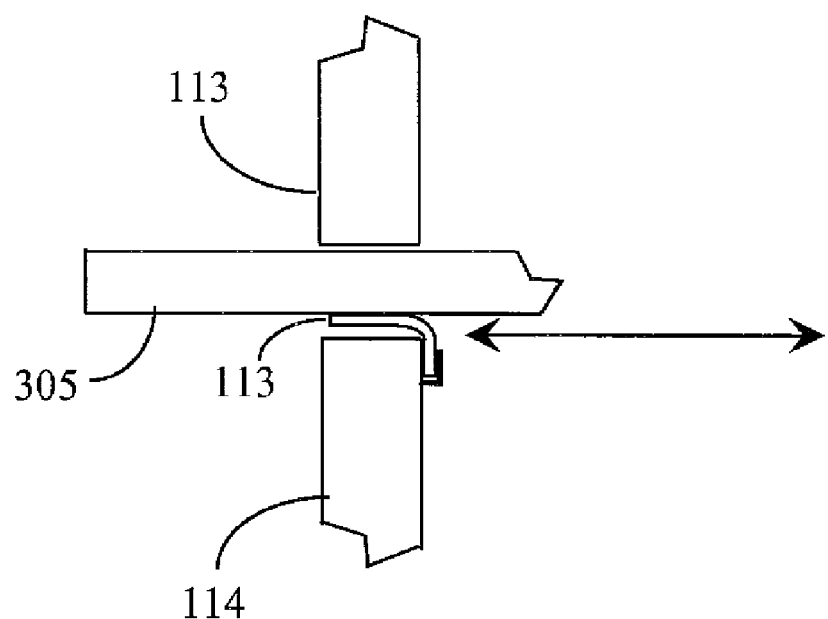

FIGS. 4a and 4b are a diagrams showing one way a protective cover may be implemented.

Figure 5:
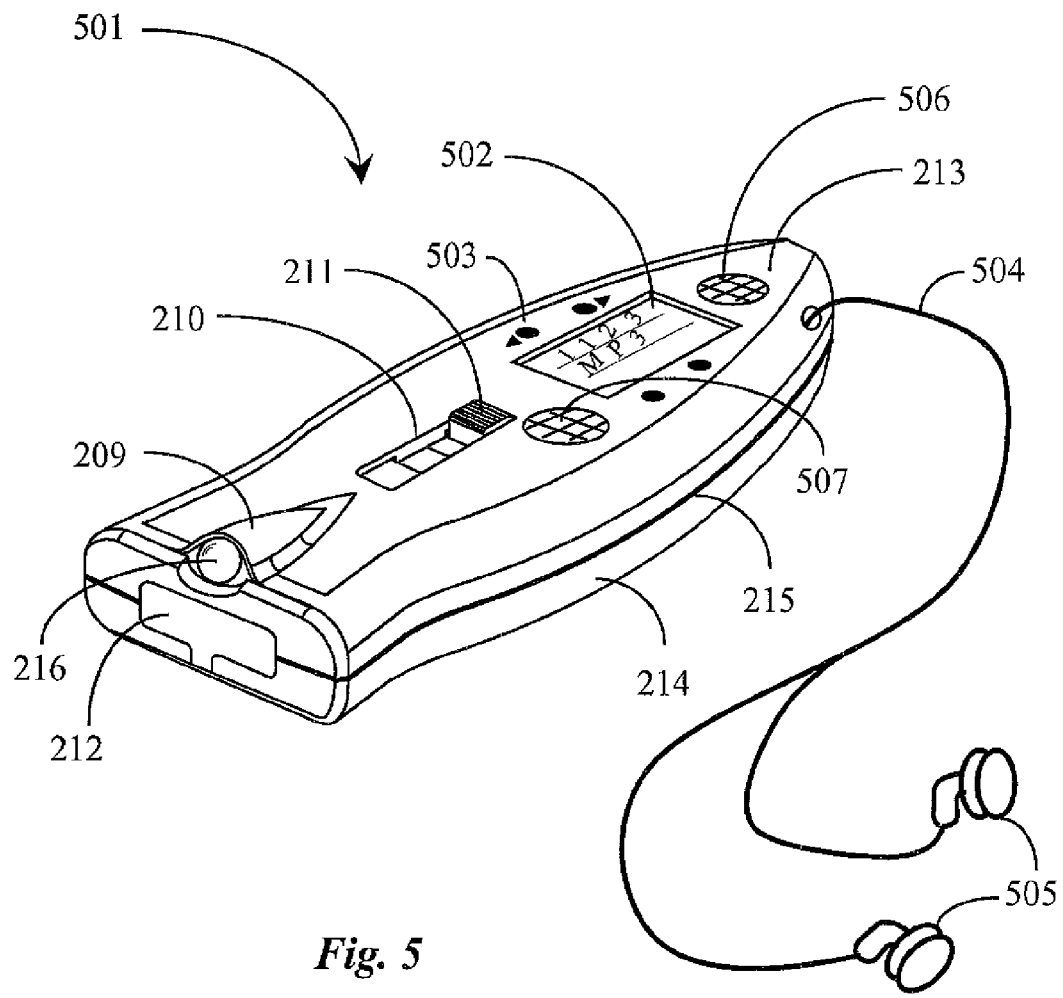

FIG. 5 is a perspective view of a thumb drive according to yet another embodiment of the invention.

Figure 6:
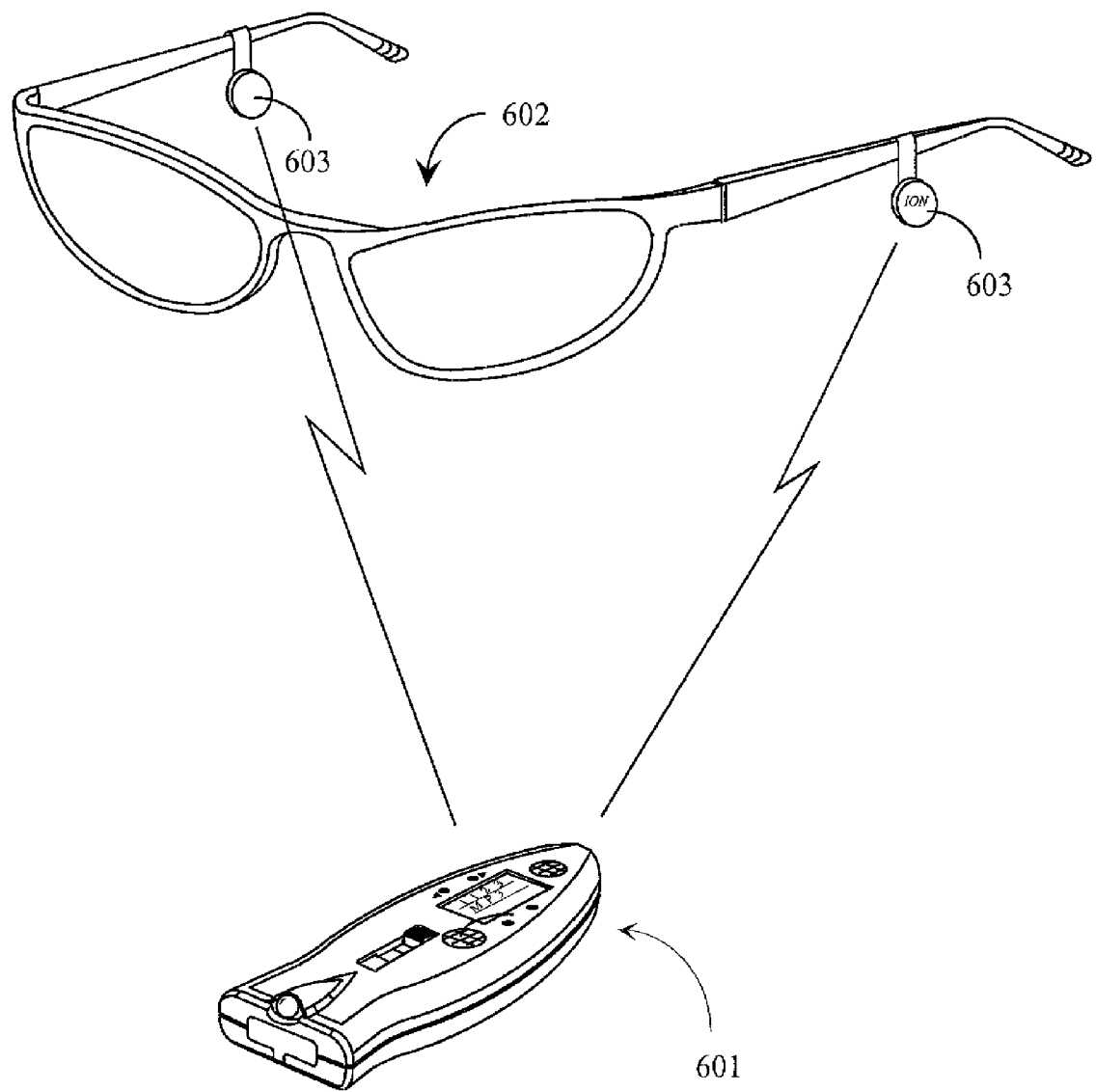

FIG. 6 is a perspective view of a thumb drive associated with a Bluetooth™ headset in yet another embodiment of the invention.

Figure 7A:
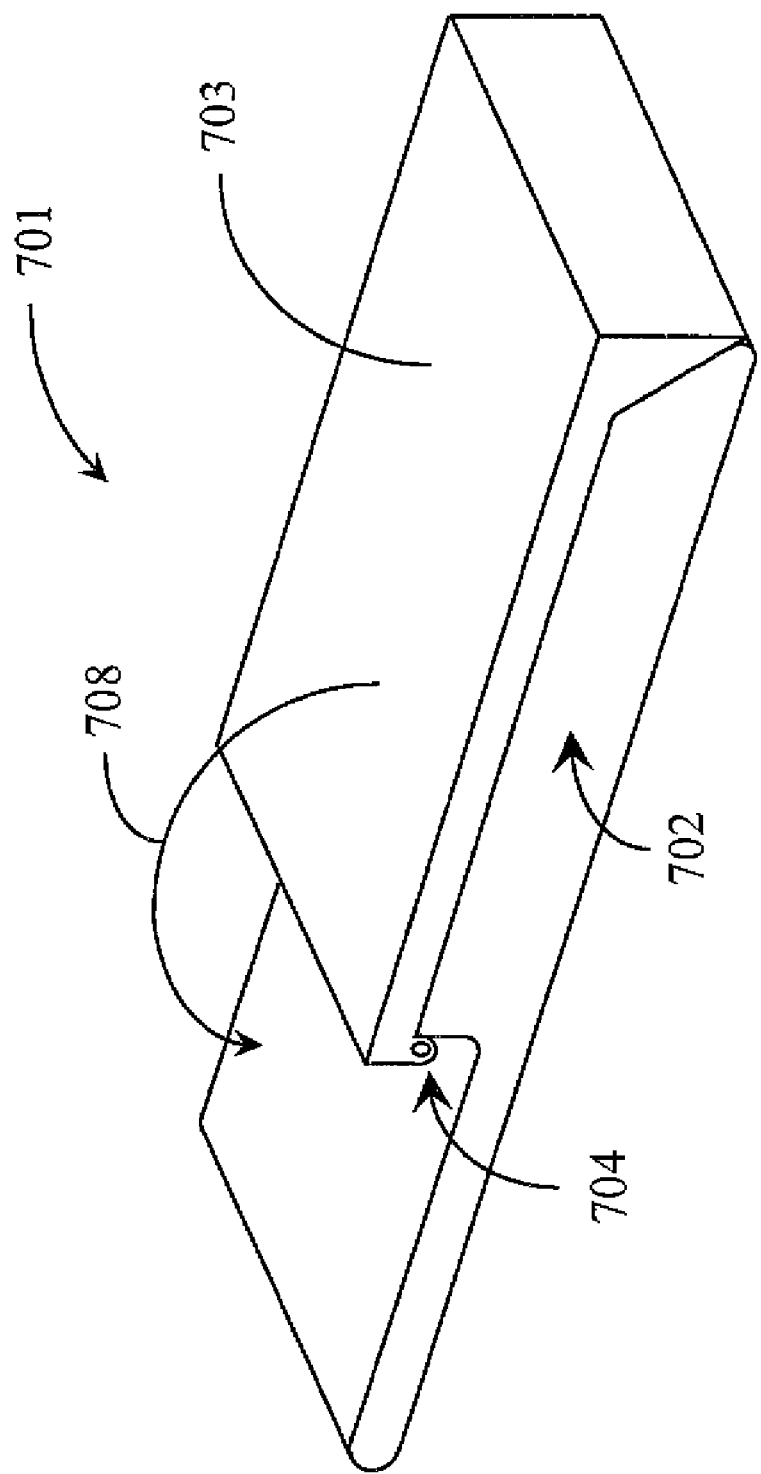

FIG. 7a is a perspective view of a retractable thumb drive in another embodiment of the present invention.

Figure 7B:
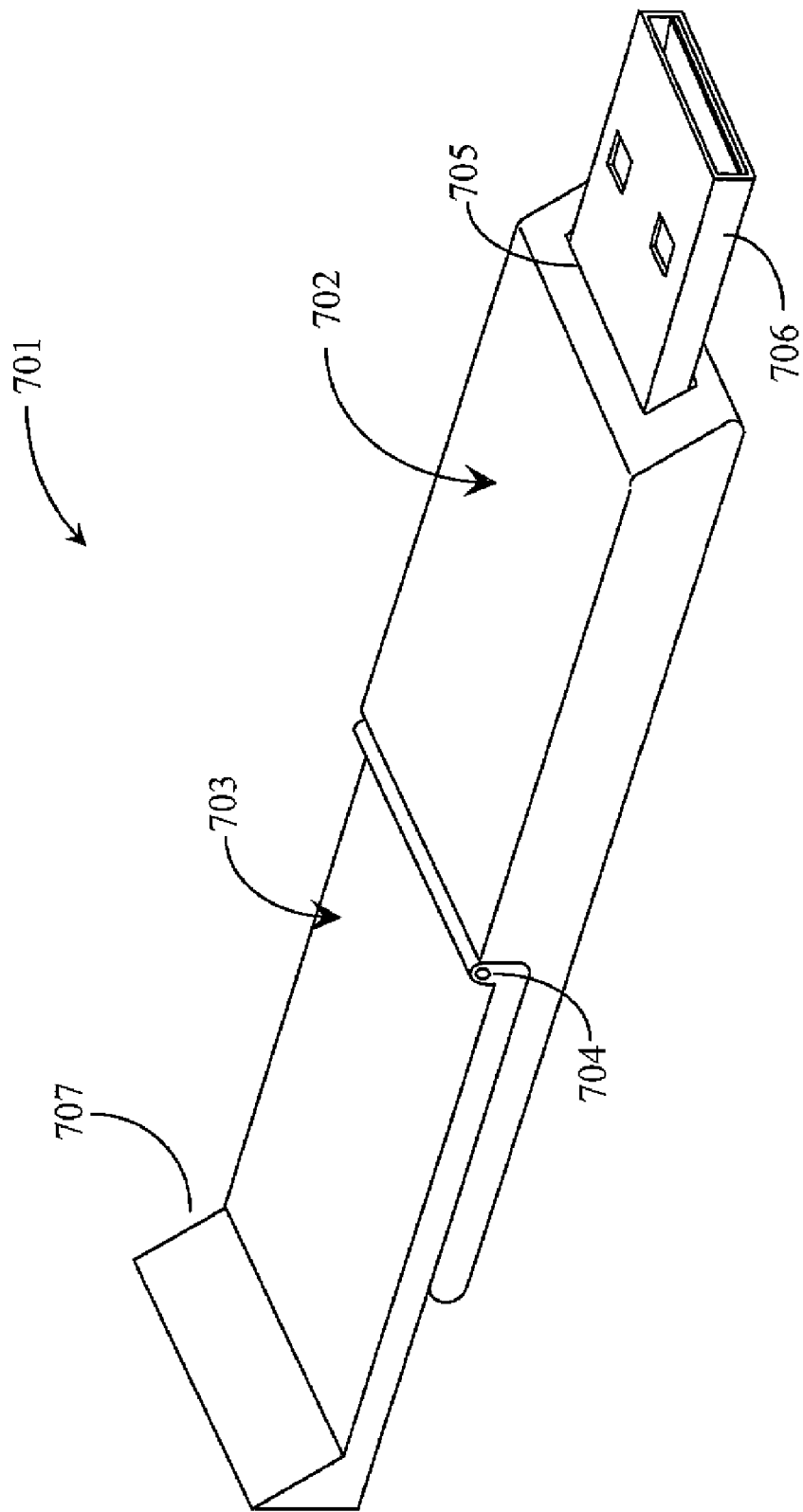

FIG. 7b is a perspective view of the drive of FIG. 7a in a different aspect.

FIG. 8 is a side view of the thumb drive of FIGS. 7a and 7b illustrating a mechanism operated by the hinged, rotating cover to extend the male USB connector.

Figure 9:
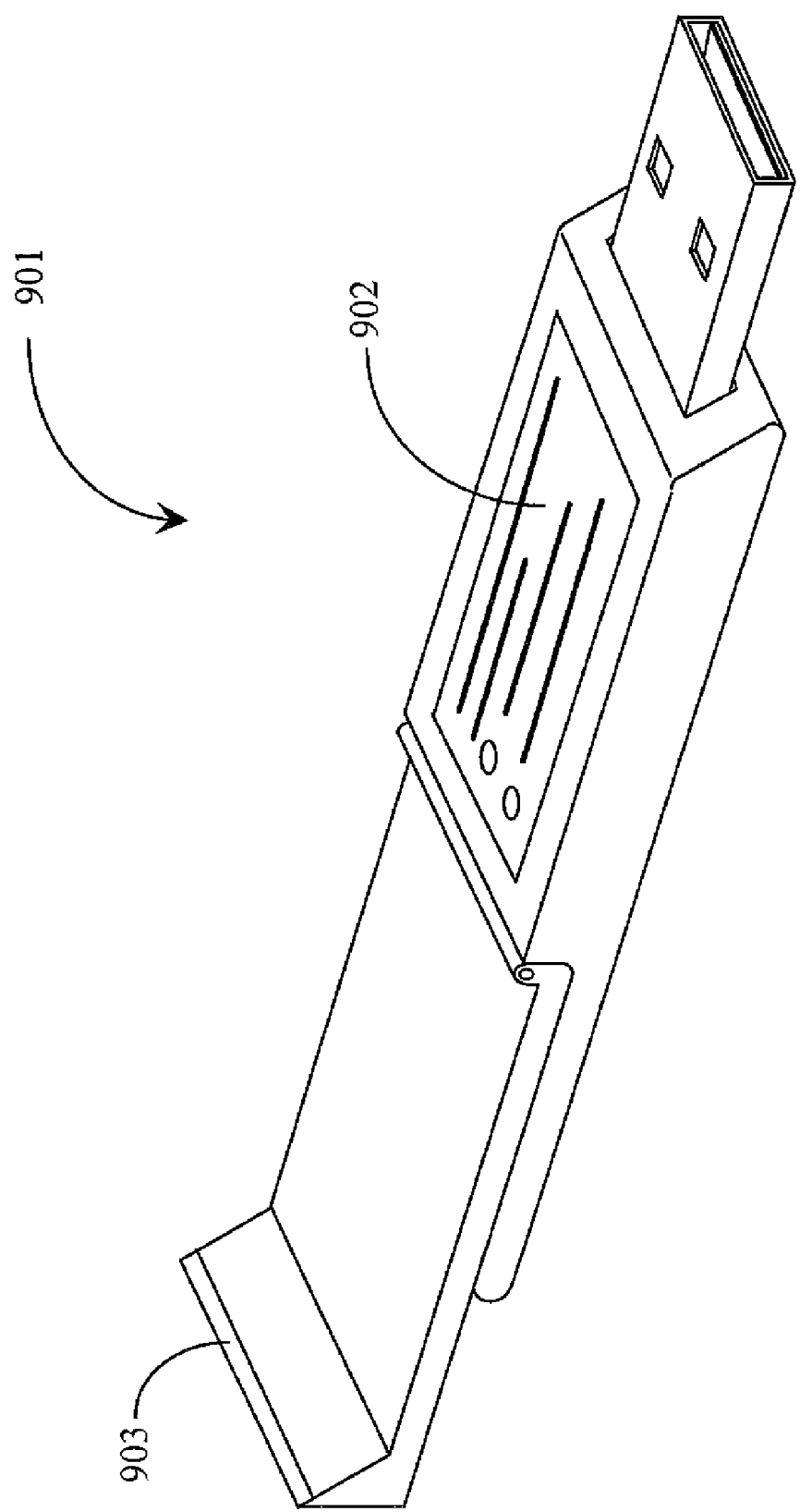

FIG. 9 is a perspective view of a thumb drive 901 in another embodiment of the invention.

Figure 10:
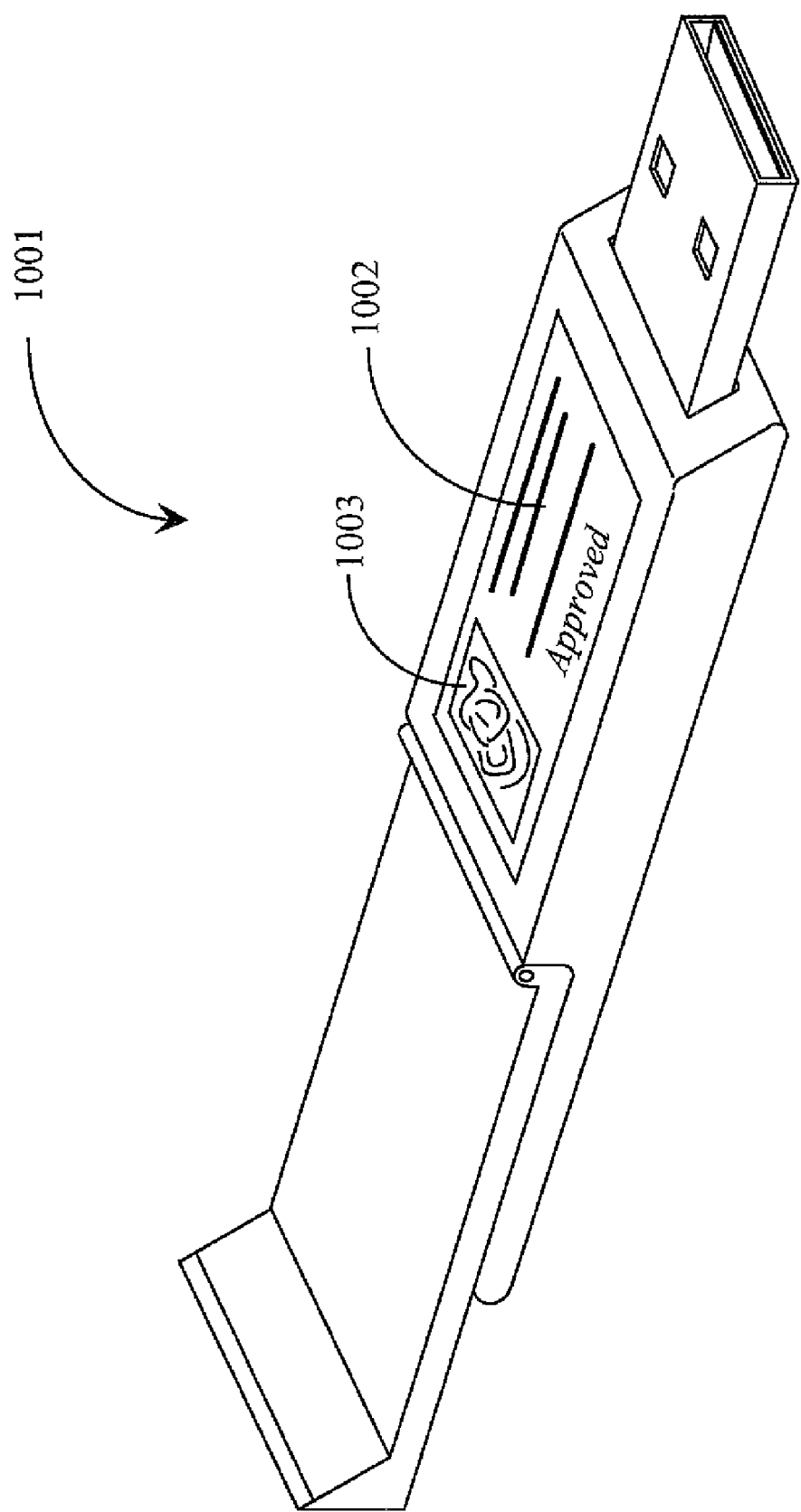

FIG. 10 illustrates a drive 1001 in another embodiment of the invention.

DESCRIPTION OF THE PREFERRED EMBODIMENTS

Figure 1A:
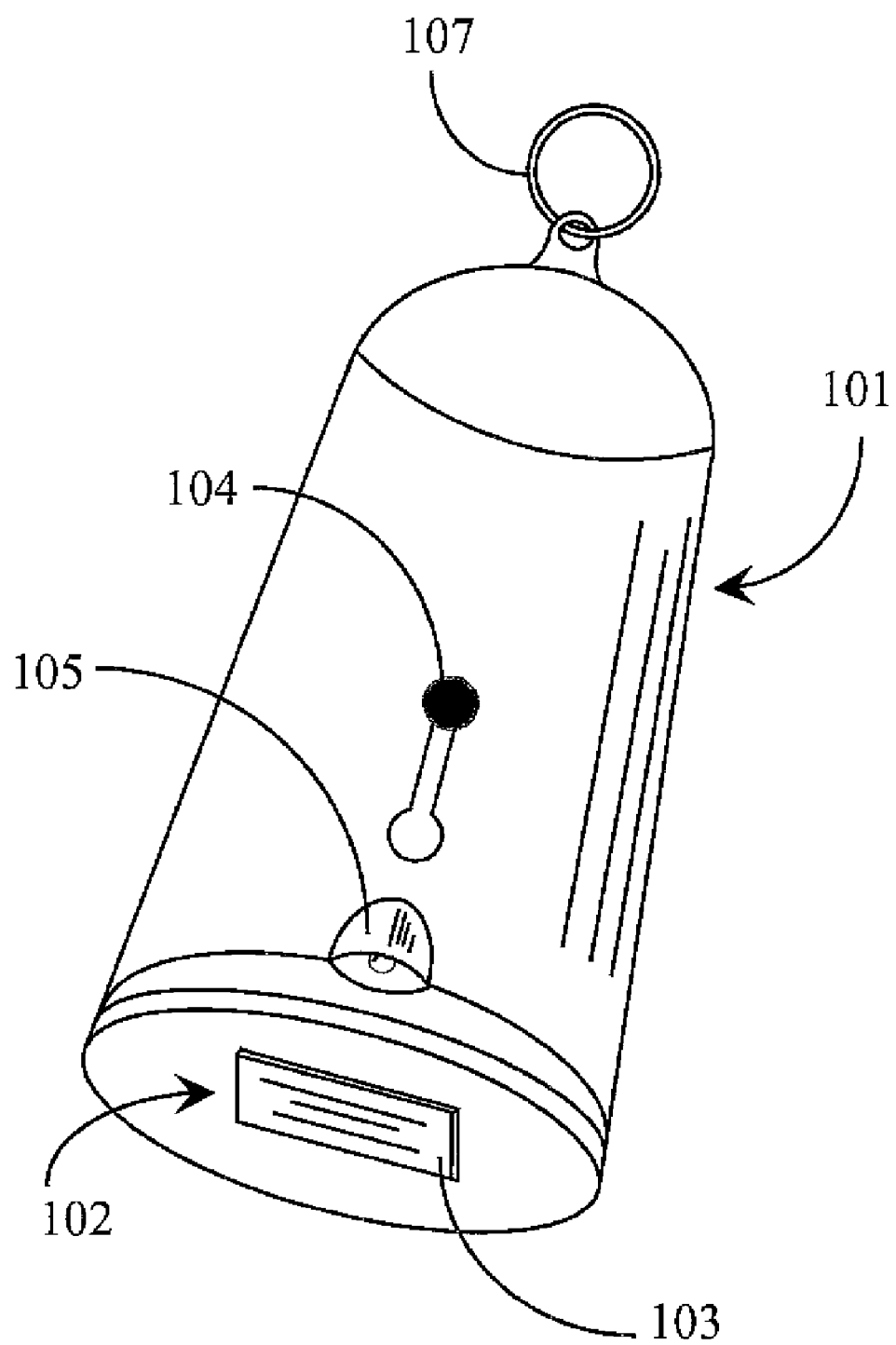
FIG. 1a is a perspective view of a thumb drive according to an embodiment of the present invention, with the connector retracted.

In one embodiment of the invention a thumb drive has a manually extendable and retractable male USB connector. FIG. 1a is a perspective view of such a drive 101 according to an embodiment of the invention.

Drive 101 has in this example a physical opening 102 generally rectangular in shape, matching the rectangular cross section of a male USB connector. Port 102 is closed, when the connector is withdrawn within a body of the thumb drive, by a retractable physical closure, such as a flap gate 103, which may be hinge mounted in one embodiment to allow passage of a male USB connector.

It will be apparent to the skilled artisan that there are a variety of ways a closure may be implemented for opening 102. Such a closure may be made of a number of different materials, such as rubber or plastic materials, and may be implemented in a number of different ways. For example, the gate could be a solid metal or rigid plastic material, and a mechanism for opening and closing may be provided also in a number of different ways.

Further to the above description, a sliding button 104 is implemented through an opening in a wall of a case for the drive. This button in one embodiment has two functions. Firstly the button is implemented in a manner to turn on a flashlight element 105 when the button is depressed. Secondly, the button is detented in a way that when depressed it may be pushed forward, causing an internal mechanism to translate forward, urging a male USB connector to extend through port 102, and to lock in place as extended. The locking in place in one embodiment is a function of the detenting of the button mechanism.

It will also be apparent to the skilled artisan that such a manual operator for translation of a mechanism to extend the male connector through opening 102 may be implemented in several ways as well, such as by a knob or a slide. In one embodiment, for example, the retractable connector is spring-loaded into the case of the thumb drive with a detent for keeping it retracted until a user trips the detent. A similar detent keeps the connector in an extended position until the user pushes the connector back into the case.

Light 105 in one embodiment is offset to one side of the thumb drive as shown, and is provided for aiding in finding a USB port on a candidate computer. The light may also be used as a utility flashlight for a number of other purposes. The skilled artisan will understand that there are a variety of ways control for the light may be provided in addition to the slide button 104, such as by a separate switch implemented through the body of the thumb drive.

Figure 1B:
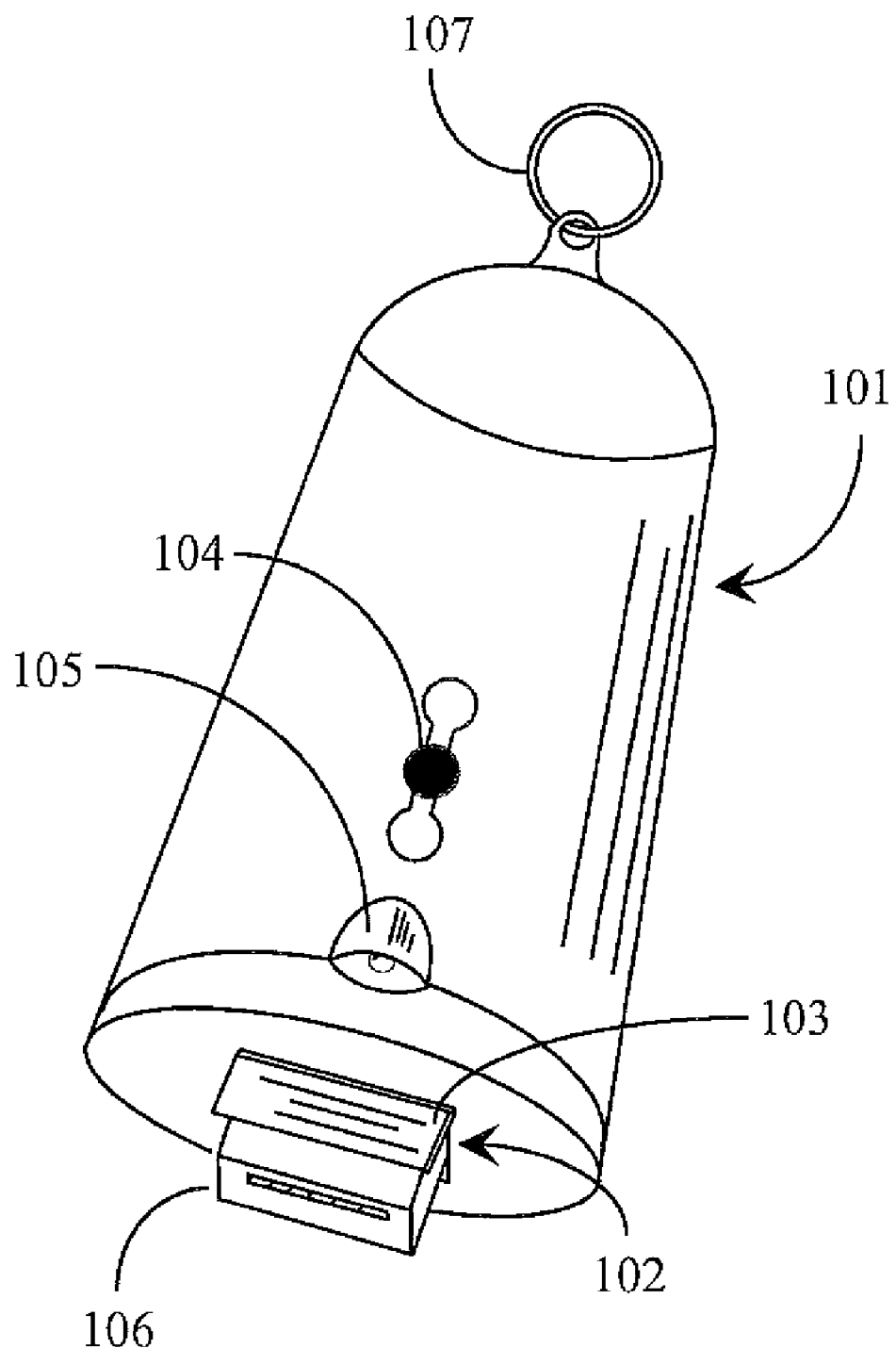
FIG. 1b is a perspective view of the thumb drive of FIG. 1a with the connector partly extended.

FIG. 1b is a perspective view of the thumb drive of FIG. 1 with a USB male connector extended part way through port 102. It may be seen that the relative position of slide button 104 corresponds to the relative extension of the USB port 106.

Figure 1C:
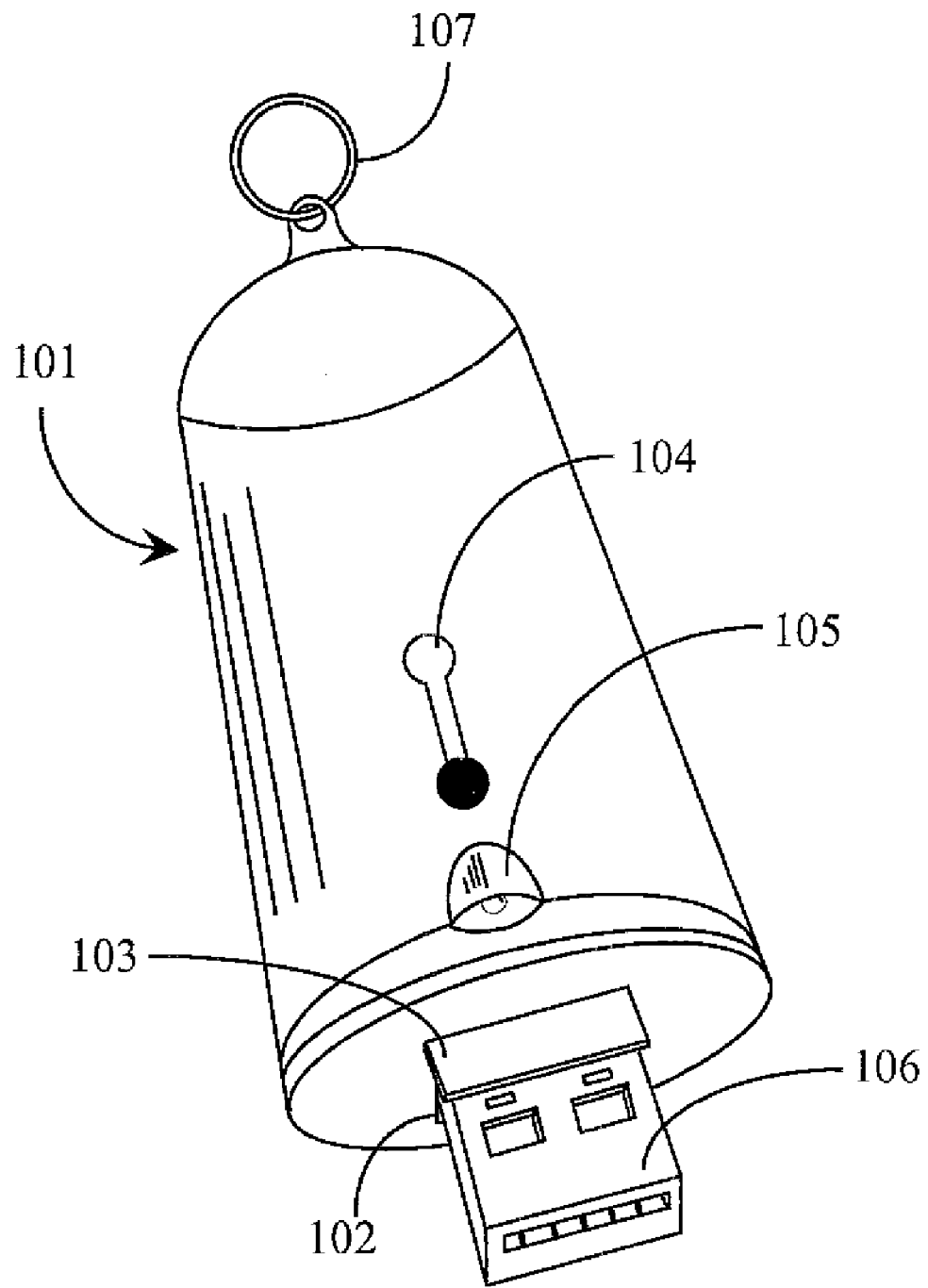
FIG. 1c is a perspective view of the thumb drive of FIG. 1a with the connector fully extended.

FIG. 1c is a perspective view of the thumb drive of FIGS. 1a and 1b with male connector 106 fully extended and locked into place. In some embodiments of the invention a connection ring 107 may be provided to facilitate attachment to a neck cord or key ring.

Figure 2:
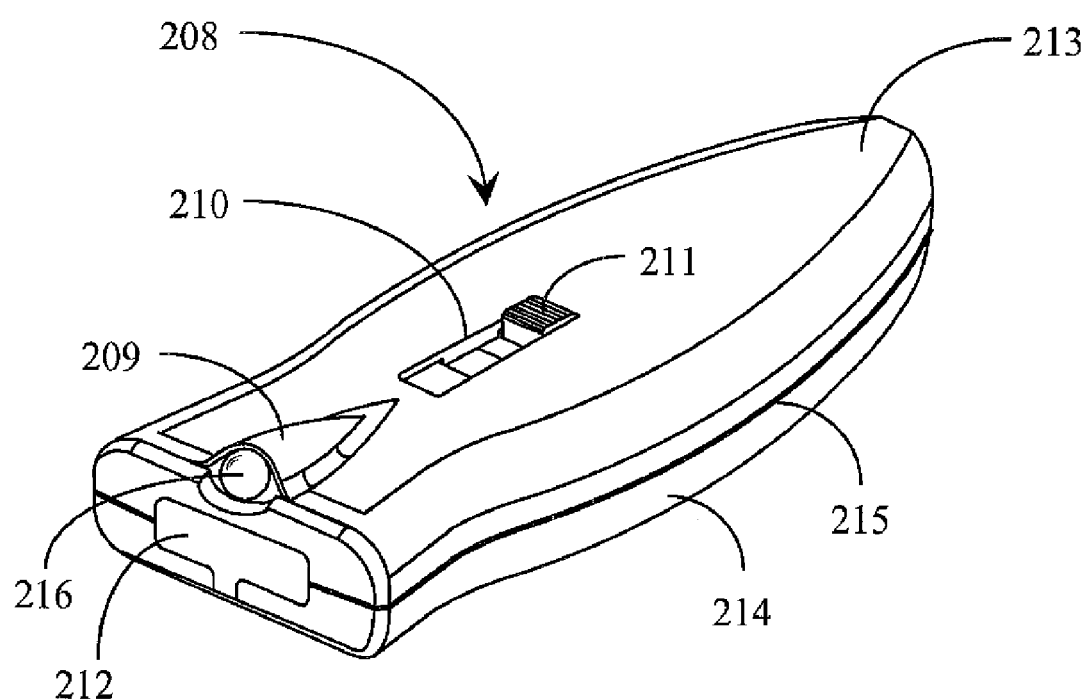
FIG. 2 is a perspective view of a thumb drive according to an alternative embodiment of the present invention.

FIG. 2 is a perspective view of a thumb drive 208 in yet another embodiment of the present invention. In this embodiment a body shape is implemented that provides a more comfortable and secure grip when using the drive. Many of the elements for the embodiment shown by FIG. 2 are the same as for the embodiment shown by FIGS. 1a-1c. There is a molded body that, in this case, is made in two separate parts 213 and 214, joining along a line 215. A raised portion 209 of the upper section 213 provides a housing for a light 216, which may be one or a cluster of high-intensity LEDs or an incandescent bulb, for example. A spring-loaded button 211 is implemented through an opening 210 in section 213 for on-off input for the light 216 and slide operation for a male USB connector that may be caused to extend through door 212 by urging button 211 forward. Detents implemented in opening 210 provide for restraining the USB connector in extended or retracted position, as further described below.

FIG. 3a is a partially exploded perspective view of thumb drive 208 of FIG. 2, showing some further detail of inner components. Section 213 is shown disconnected from section 214 and raised to show additional inner detail. Within the thumb drive a module 301 comprises flash memory, in quantity of perhaps 256 Mbytes, or more. Module 301 also comprises button 211 implemented in a structure 302 that allows the button to be depressed and to make electrical contact to energize light 216 through a connection path 303 from an on-board battery source 304. The battery can be any one of many sorts, such as a rechargeable battery.

The internal flash memory of module 301 is coupled to I/O contacts of a USB male connector 305 which is built into module 301. Internal connections, microprocessor, and firmware applying the microprocessor to functions of the apparatus are not shown, but will be apparent to those with skill in the art, as these mostly exist in the commercial arena at the time of filing the present application.

Module 301 in this an some other embodiments is implemented within the shell of portions 213 and 214 restrained between molded-in tracks, such that the module may be translated from a position wherein USB male connector 305 is fully withdrawn, to a position wherein the USB connector is fully extended, and back again. Detents molded into upper portion 213 in conjunction with opening 210 provide for retention at the fully withdrawn and near the fully extended positions, in concert with depressing button 211. To extend or withdraw one may depress button 211 and release it at the end of the movement. When USB connector 305 extends, door 212 is urged aside in a manner that when the USB connector is again withdrawn, the door closes again.

FIG. 3b shows one edge 306 of opening 210 of portion 213 in elevation. This edge of the opening is formed into lands at two elevations, these being lands 308 and 310 at a lower level and lands 309 and 311 at a higher level.

Figure 3C:
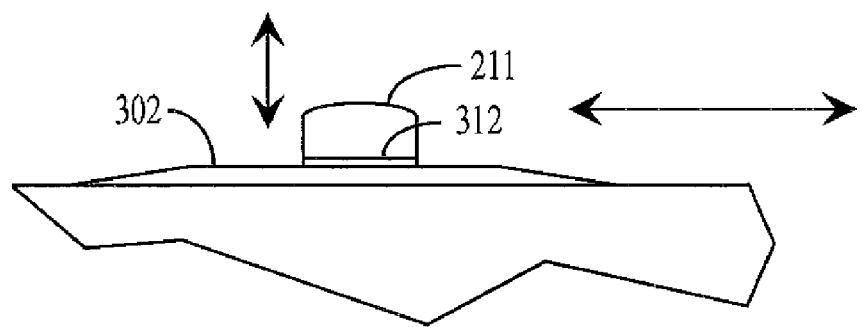

FIG. 3c shows button 211 and structure 302 implemented on module 301. As previously described, structure 302 allows button 211 to be depressed to make electrical contact to illuminate light 216. Button 211 further has a land 312, also seen in FIG. 3a in perspective that engages one of lands 308-311 in assembly, depending on the relative extension of connector 305.

Figure 3D:
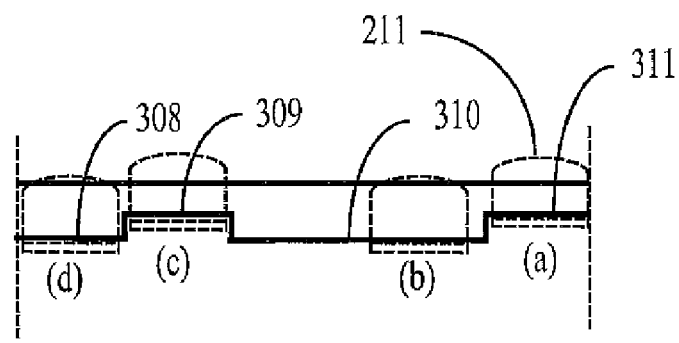

FIG. 3d shows edge 306 with lands 308-311 with button 211 superimposed at four different positions (a) through (d) representing four different extensions of connector 305. With button 211 in position (a) the male USB connector is fully retracted within the body of the thumb drive. Because button 211 is spring-loaded upward, this provides a detent that holds the connector retracted until a specific action by the user.

To move the connector forward, that is, to extend the connector, a user depresses button 211 such that land 312 of the button is below land 310 of edge 306. This depressing of button 211 makes electrical contact turning on light 216. Now module 301 may be moved forward by urging button 211 forward to extend USB connector 305. Land 310 ensures that the light stays on if the button is released.

Land 308 allows the user to move connector 305 to a maximum forward position, passing land 309, at which point the light will stay lit. This allows for the user to release the button while looking for a female USB port for connection, and keeps the light on.

When the female USB port is found and male connector 305 is inserted, the action of insertion will retract the male connector in the thumb drive until the spring-loaded button clicks up to land 309, providing a detent near the fully extended poison with the light off and the thumb drive connected to the appliance having the female USB port.

The skilled artisan will be aware that the detent mechanisms described above with reference to FIGS. 3b-3d are exemplary of one such mechanism that might be used, and that are there are a variety of other ways the detents may be provided.

One simple rendition of a door 112 or 212 is shown in FIGS. 4a and 4b. In this example a rubber-like panel 112 is affixed behind an opening between upper and lower portions 113 and 114. As connector 305 is extended from the poison shown in FIG. 4a the rubber-like panel is simply urged aside, until with full extension, panel 112 is positioned as shown in FIG. 4b. When connector 305 is again withdrawn panel 112 springs back to an upright position as shown in FIG. 4a, closing the opening to dust and debris, for example.

It will be apparent to those with skill in the art that the door for the opening through which the male USB connector protrudes, such as panel 112 in FIGS. 4a and 4b, is not in and of itself the patentable feature of the invention, but a convenience to protect the internal details of the novel thumb drive when the connector is withdrawn. Simple examples of such a door have been provided, but there are a further variety of ways such a protective door might be implemented. There might be, for example, a rigid door hinged in some manner, and the door may or may not be closed by a spring detent. There are many other possibilities as well.

In embodiments of the invention described above there is no need for a protective plastic cap for the male USB connector as is common in the art at the time of filing the present application, and the light integrated into the thumb drive in some embodiments provides real aid to a user in finding and connecting to unused USB ports. The light has other uses as a simple utility flashlight as well.

In another embodiment of the present invention, illustrated in FIG. 5, further enhancement is provided such that a thumb drive 501 may also operate as a music repository and player, such as an MP3 player. In this embodiment the memory capacity of the thumb drive is controlled in the same manner that is done in the art for MP3 players and the like, so that music and other audio material may be downloaded to the unique thumb drive from a computer device, and may be played back to a user. For this purpose a display 502 is provided, which may be an LED (light-emitting diode) or an LCD (liquid crystal display) is provided, and additional firmware for internal microprocessor control is provided to manage storage of audio files, such as MP3 files, for songs, and to display and render the songs at a user's command.

Appropriate controls, such as buttons 503 for scrolling through a playlist, are provided, and audio rendition is through line 504 to a set of ear-buds 505. Earphones may be used as well, or any set of battery-powered or conversion unit powered speakers, such as those sorts of speakers used with PCs from a soundcard. In some embodiments a microphone 506 is also provided, and controls are provided for a user to record such as memorandums and notes, using the thumb drive as a personal digital recorder. A small, built-in speaker 507 may also be implemented in some embodiments.

FIG. 6 is a perspective view of a thumb drive 601 associated with a Bluetooth™ headset in still another embodiment of the invention. Bluetooth™ is a well-known system and protocol for wireless transmission of audio and other data over relatively short distances, and information relative to same is easily accessible to the skilled artisan. In this embodiment thumb drive 601 comprises a Bluetooth™ transmitter, which transmits to left and right earpieces 603 adapted to a pair of glasses 602, such as sunglasses. The controls for thumb drive 601 are essentially the same as described above for drive 501. In alternative embodiments the Bluetooth™ earpieces may be worn separately from the glasses, or may be associated with a hat or a cap for example.

FIG. 7a is a perspective view of a retractable thumb drive in another embodiment of the present invention.

A purpose of drive 701 shown in FIG. 7a is to provide a simplified apparatus and method for extending and retracting the male USB connector into and out of a housing enclosure, while at the same time, providing protection to the USB male connector when in a retracted position. This invention is designed to accommodate consumer products where male USB connectors are needed, such as USB Flash Drives and MP3 Players.

In one embodiment, a housing enclosure 702 houses digital memory, which may be one of several different sorts, a male USB connector coupled to the memory, and mechanism for holding and guiding the connector into and out of the housing. A hinged cover 703 closes over housing 702 in one direction of rotation, and covers an opening (not shown in FIG. 7A) that allows the USB male connector to extend from housing 702. Cover 703 also serves as a lever coupled to mechanism for extending the male USB connector. When cover 703 is lifted up and rotated in the direction of arrow 708 it engages an actuator coupled to the memory/connector assembly in the housing, and causes that assembly to translate from within the housing to extend from the housing so it may be engaged in a female USB connector of another device.

FIG. 7b illustrates drive 701 with cover 703 rotated such that USB connector 706 is extended through opening 705. The male USB connector extends evenly as the cover is rotated, and is fully extended when the cover is fully rotated.

Figure 8A:
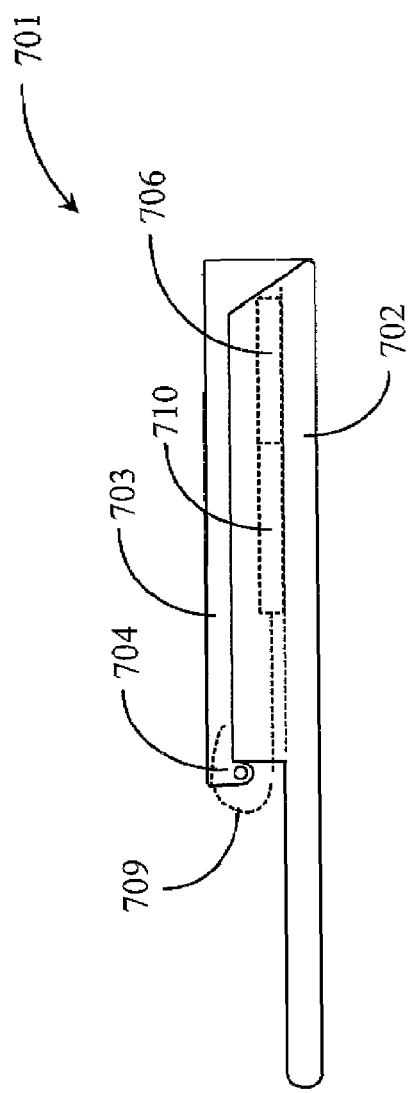

FIG. 8a is a side elevation view of the thumb drive of FIGS. 7a and 7b illustrating a mechanism operated by the hinged, rotating cover to extend the male USB connector. In FIG. 8a cover 703 is shown closed over housing 702 with a flexible strip 709 connected inside of the cover and at one end of the assembly of memory 710 and USB connector 706.

Figure 8B:
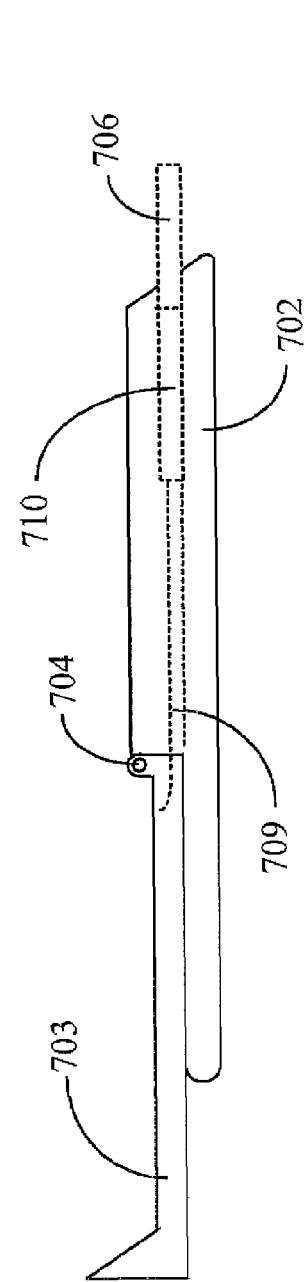

FIG. 8b illustrates the same thumb drive with the cover rotated to the left opening the front of the thumb drive and straightening strip 709 such that the assembly of memory 710 and connector 706 is moved forward to extend the connector to outside the housing. This is one optional mechanism for extending the connector, and several other mechanisms are possible, such as a gear mechanism.

FIG. 9 is a perspective view of a thumb drive 901 in another embodiment of the invention. In this embodiment when the cover is opened a flexible screen which may be a light-emitting diode (LED) screen or an Organic Light-Emitting Diode (OLED) screen display 902 located on the outside/top of the housing enclosure is exposed. The screen display is interactive in this embodiment and enables a user to select and initiate certain functions, such as selecting and accessing data files and audio files stored on the onboard memory. The cover also has a LED or OLED light panel 903 that blinks or glows red while data is in the process of transferring to or from an external device. The LED or OLED light panel turns green when data has successfully transferred to or from the external device.

In FIG. 9 the interactive display is shown as implemented on a surface of the housing enclosure. In an alternative embodiment the interactive screen is implemented on a flexible sheet that folds over such that when the cover is pivoted open, the display unfolds over both the housing and the (open) hinged cover.

FIG. 10 illustrates a drive 1001 in another embodiment of the invention. In this embodiment interactive interface 1002 has a biometric fingerprint reader 1003 within the display, and when a user's fingerprint/thumbprint is successfully scanned and matches a stored print, this fact is indicated by the fingerprint/thumbprint turning a specific color, such as green, and/or additional specific text may appear on the screen display to indicate a successful scan, such as the word APPROVED. If the biometric fingerprint/thumbprint reader does not get a successful match then the fingerprint/thumbprint may turn another specific color, such as red, additional specific text might appear also on the screen display to indicate the unsuccessful scan, such as the word DENIED.

In various embodiments of the invention different features may be combined. For example, in one embodiment a retractable male USB connector is provided, but there is no light and no MP3 capability. In another there is a light, but no MP3 and no retractable connector. In yet another embodiment the light and the retractable connector are combined as shown in various embodiments described above. Different embodiments may incorporate any different combination of features.

It will be apparent to the skilled artisan that there are a broad variety of changes that may be made in the embodiments of the invention described above without departing from the spirit and scope of the invention. For example, there are a broad variety of materials that may be used for various elements of the thumb drive in embodiments of the invention. The controls in those embodiments that provide audio playback can be done in several ways. There are various ways the extendable male connector may be implemented, and the like. There are a wide variety as well of ways the control functions may be implemented. Therefore the invention should only be limited by the claims which follow.

What is claimed is:

1. A thumb drive comprising:
an elongated housing enclosing a coupled memory and male USB connector constrained on a translation mechanism in the direction of the long dimension of the housing, with an opening at a first end of the housing through which the male USB connector may extend and retract;
a cover hinged at a second end opposite the first end of the housing, the cover shaped to fold over the housing when closed and having an extension that covers the opening for the connector at the first end of the housing; and
a mechanism coupling the cover and the USB connector such that the cover being rotated from the closed position extends the USB connector from the opening, the connector fully extended with the hinged cover fully rotated open.

2. The thumb drive of claim 1 wherein the mechanism coupling the cover and the USB connector is a flexible strip coiled such that rotating the cover open uncoils the strip translating the connector from the housing through the opening.

3. The thumb drive of claim 2 wherein the mechanism is a geared mechanism.

4. The thumb drive of claim 1 further comprising a light-emitting element for indicating transfer of data to or from the drive.

5. The thumb drive of claim 4 wherein the light-emitting element displays one color when no data is being transferred, and another color when data is being transferred.

6. The thumb drive of claim 1 further comprising an interactive display implemented on an upper surface of the housing, such that the display is covered when the cover is rotated closed, and uncovered and accessible to a user when the cover is rotated open.

7. The thumb drive of claim 6 wherein the interactive interface comprises mechanisms for the user to select specific files and initiate specific functions.

8. The thumb drive of claim 6 wherein the interactive display is one of a light-emitting diode or an organic light-emitting diode.

9. The thumb drive of claim 6 wherein the interactive display further comprises a fingerprint reader for scanning a fingerprint or thumbprint of the user, and comprising a function for comparing a scanned print with a stored print.

10. The thumb drive of claim 9 wherein the finger print reader changes color to indicate success or failure of a match.

11. The thumb drive of claim 9 wherein the interactive display presents text to indicate success or failure of a match.

* * * * *